（12) United States Patent
Sekimoto

(10) Patent No.: US 6,816,098 B2
(45) Date of Patent: Nov. 9, 2004

(54) HIGH-SPEED OVERSAMPLING MODULATOR DEVICE

(75) Inventor: Uichi Sekimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/690,974

(22) Filed: Oct. 23, 2003

(65) Prior Publication Data

US 2004/0113825 A1 Jun. 17, 2004

(30) Foreign Application Priority Data

Oct. 24, 2002 (JP) ........................ 2002-309750

(51) Int. Cl.$^7$ ............................................. H03M 3/00
(52) U.S. Cl. .................................................... 341/143
(58) Field of Search ................................ 341/143, 144, 341/155

(56) References Cited

U.S. PATENT DOCUMENTS 5,699,064 A * 12/1997 Sakiyama et al. .......... 341/154
6,057,794 A * 5/2000 Takamuki ................... 341/143
2002/0041244 A1 * 4/2002 Gandolfi et al. ............ 341/143
2003/0117306 A1 * 6/2003 Okuda et al. ............... 341/143

FOREIGN PATENT DOCUMENTS

JP         6-13906      1/1994     ............ H03M/3/02

* cited by examiner

Primary Examiner—Peguy JeanPierre
(74) Attorney, Agent, or Firm—Arent Fox, PLLC.

(57) ABSTRACT

An oversampling modulator device includes an adder outputting an signal indicating a sum of an input signal and a first delayed signal, the input signal having a plurality of bits, the output signal having upper bits included in a first signal and the remaining bits included in a second signal. A subtractor outputs a signal indicating a difference between the first signal and a second delayed signal. A first delay unit outputs the first delayed signal by delaying a third signal having upper bits produced by the subtraction signal and lower bits produced by the second signal. A quantizer performs quantization processing of the third signal and outputs a quantization signal having a predetermined number of bits. A second delay unit outputs the second delayed signal by delaying the quantization signal. The quantizer selects specific bits included in the third signal to generate the quantization signal.

10 Claims, 7 Drawing Sheets

HIGH-SPEED OVERSAMPLING MODULATOR DEVICE

CROSS-REFERENCE TO RELATED APPLICATIONS

This application is based upon and claims the benefit of priority from the prior Japanese patent application No. 2002-309750, filed on Oct. 24, 2002, the entire contents of which are incorporated herein by reference.

BACKGROUND OF THE INVENTION

1. Field of the Invention

The present invention relates to an oversampling modulator device which is used for digital-to-analog conversion and analog-to-digital conversion, and more particularly to an oversampling modulator device which is used to suppress the quantizing error in a delta modulator, a sigma-delta modulator or a multi-stage error shaping modulator.

2. Description of the Related Art

Digital-to-analog conversion is the process of converting digital codes into a range of analog signal levels. Analog-to-digital conversion is the process of converting a range of analog signal levels into digital codes. According to the Nyquist sampling criterion, A/D converters which use a sampling frequency that is slightly more than twice the highest frequency in the analog signal allow the original information of the analog signal to be transmitted and restored without loss.

Suppose that the highest frequency in the analog signal is indicated by "fa", the sampling frequency is indicated by "fb", and the number of bits (resolution) in the digital code is indicated by "n" (fa, fb, and n are positive integers). The maximum "S/N_MAX" of the signal-to-noise ratio S/N in the analog-to-digital conversion is represented by the following formula:

$$S/N\_MAX = (3/2) \times 2^{2n} \times (fa/2fb)$$

As is apparent from the above formula, if the bit number "n" is raised by one, the signal-to-noise ratio S/N is improved by 6 dB. If the sampling frequency "fb" is doubled, the signal-to-noise ratio S/N is improved by 3 dB. Thus, in order to raise the accuracy of conversion (or to lesson the quantizing noise), it is necessary to increase the number of bits or to raise the sampling frequency.

Moreover, using a sigma-delta modulator makes it possible that the quantizing noise is made large at the high frequency side and made small at the low frequency side. Hence, if the quantizing noise becomes low in the vicinity of the highest frequency in the analog signal, the signal can be restored with a high level of accuracy.

FIG. 1 shows an example of a conventional oversampling modulator device.

The conventional oversampling modulator device in FIG. 1 includes an adder 21, a subtractor 22, a quantizer 23, a delay element 24, a delay element 25, and a decoder 26.

The adder 21 outputs a signal 202 indicating a sum of a 10-bit input signal 201 and a 10-bit return signal 204. The subtractor 22 outputs a difference signal 203 indicating a difference between a 10-bit return signal 206 and the 11-bit output signal 202 from the adder 21. The quantizer 23 performs a quantization process of the output signal 203 of the subtractor 22, and outputs a 10-bit quantization signal 205 indicating the quantization result. The quantization signal 205 is sent to a decoder 26. The decoder 26 performs the decoding process of the quantization signal 205 and outputs a 3-bit output signal 207, indicating the decoding result, to a subsequent-stage external device (not shown).

The output signal 203 of the subtractor 22 is sent to the delay element 24, and the delay of one clock is added to the signal 203 at the delay element 24. The delay element 24 outputs the one-clock delayed signal to the adder 21 as the 10-bit return signal 204.

Moreover, the quantization signal 205 outputted by the quantizer 23 is sent to the delay element 25, and the delay of one clock is added to the signal 205 at the delay element 25. The delay element 25 outputs the one-clock delayed signal to the subtractor 22 as the 10-bit return signal 206.

FIG. 2 shows an example of a conventional quantizer in a case of setting the quantization width to 128.

The quantizer shown in FIG. 2 includes magnitude comparators 30, 31 and 32, AND gates 33 and 34, selector units 35, 36, 37 and 38, and an OR gate 39.

In the quantizer of FIG. 2, each of the magnitude comparators 30-32 has two inputs A and B and two outputs G and L, and operates as follows. When the inputs A and B of the comparator meet the condition A<B, the output L of the comparator is set to 1 and the output G of the comparator is set to 0, and when the conditions A≧B are met, the output L of the comparator is set to 0 and the output G of the comparator is set to 1.

The input signal 300 corresponds to the 10-bit signal 203 in the conventional modulator device of FIG. 1. The input signal 300 is sent to each of the inputs A of the magnitude comparators 30, 31 and 32.

Suppose that the quantization width of the quantizer of FIG. 2 is set to 128 (in decimal number). The input signal 310 which is sent to the input B of the magnitude comparator 30 and one input of the selector 36 is set to 128 in decimal. The input signal 311 which is sent to the input B of magnitude comparator 31 and one input of the selector 37 is set to 256 in decimal. The input signal 312 which is sent to the input B of the magnitude comparator 32 and one input of the selector 38 is set to 384 in decimal. The input signal 313 which is sent to one input of the selector 35 is set to 0 in decimal.

The output L of the magnitude comparator 30 is connected to the other input of the selector 35 through the signal line 301. The output G of the magnitude comparator 30 and the output L of the magnitude comparator 31 are connected to the two inputs of the AND gate 33 through the signal line 302 and the signal line 303, respectively. The output G of the magnitude comparator 31 and the output L of the magnitude comparator 32 are connected to the two inputs of the AND gate 34 through the signal line 304 and the signal line 305, respectively. The output G of the magnitude comparator 32 is connected to the other input of the selector 38 through the signal line 306.

The output of the AND gate 33 is connected to the other input of the selector 36 through the signal line 307. The output of the AND gate 34 is connected to the other input of the selector 37 through the signal line 308. All of the outputs of the selectors 35, 36, 37 and 38 are connected to the inputs of the OR gate 39. Therefore, the OR gate 39 outputs the quantization signal 309 by taking the OR of the output signals which are outputted by the selector 35, 36, 37 and 38 in response to the input signal 300.

In the quantizer of FIG. 2, when the input signal 300 is indicative of a number less than 128, only the signal sent on the signal line 301 is set to 1 and all the signals sent on the signal line 306, the signal line 307 and the signal line 308 are set to 0. When the input signal 300 is indicative of a number above 128 and less than 256, the signals sent on the signal line 302 and the signal line 303 are set to 1, the signal sent on the signal line 307 is set to 1, and all the signals sent on the signal line 301, the signal line 306 and the signal line 308 are set to 0.

Moreover, when the input signal 300 is indicative of a number above 256 and less than 384, the signals sent on the signal line 304 and the signal line 305 are set to 1, the signal sent on the signal line 308 is set to 1, and all the signals sent on the signal line 301, the signal line 306 and the signal line 307 are set to 0. When the input signal 300 is indicative of a number above 384, only the signal sent on the signal line 306 is set to 1 and all the signals sent on the signal line 301, the signal line 306 and the signal line 307 are set to 0.

In the case of the above-mentioned conventional device, it is necessary to complete the addition and subtraction operations, (i.e., the operations from the processing of the input signal 201 to the processing of the output signal 205 as shown in FIG. 1) within a prescribed period of time corresponding to one clock.

In addition, Japanese Laid-Open Patent Application No. 6-13906 discloses a sigma-delta modulator for use in an oversampling D/A converter to realize a high S/N ratio, as the conventional technology related to the present invention.

For the purpose of raising the operational accuracy in the conventional oversampling modulator device, the increase in the number of operation bits of the oversampling modulator and the improvement in the speed of signal processing may be taken into consideration.

However, in the case of the conventional oversampling modulator device, it is difficult to increase the number of operation bits or to accelerate the signal processing, while satisfying the conditions that the logical operations be completed within the prescribed period of time corresponding to one clock.

Moreover, a plurality of the same operational circuits may be provided in the parallel connection, so that the parallel operation is carried out in order to raise the operational accuracy in the conventional oversampling modulator device. However, the circuit scale would be large in such a case and the chip area would be increased. There is the problem that the cost is increased, and the power dissipation is also increased.

SUMMARY OF THE INVENTION

An object of the present invention is to provide an improved oversampling modulator device in which the above-mentioned problems are eliminated.

Another object of the present invention is to provide an oversampling modulator device that uses a simple quantizer in which the quantization width is set to $2^k$ (k: a positive integer), realizes multiple-bit signal processing and high-speed data processing, and reduces the number of the bits in the operational circuit without increasing the circuit scale.

The above-mentioned objects of the present invention are achieved by an oversampling modulator device comprising: an addition unit outputting an signal indicating a sum of an input signal and a first delayed signal, the input signal having a plurality of bits, the output signal divided into a first signal having a number of upper bits of the output signal and a second signal having the remaining bits of the output signal; a subtraction unit outputting a signal indicating a difference between the first signal from the addition unit and a second delayed signal; a first delay unit outputting the first delayed signal to the addition unit by delaying a third signal having upper bits produced by the output signal of the subtraction unit and lower bits produced by the second signal from the addition unit; a quantization unit performing quantization processing of the third signal and outputting a quantization signal having a predetermined number of bits; and a second delay unit outputting the second delayed signal to the subtraction unit by delaying the quantization signal, wherein the quantization unit selects specific bits included in the third signal and generates the quantization signal with the selected bits of the third signal.

The above-mentioned objects of the present invention are achieved by an oversampling modulator device comprising: a subtraction unit outputting an signal indicating a difference between a first signal and a first delayed signal, the first signal having a number of upper bits included in an input signal, the input signal having a plurality of bits and being divided into the first signal and a second signal; an addition unit outputting a signal indicating a sum of a third signal and a second delayed signal, the third signal having upper bits produced by the output signal of the subtraction unit and lower bits produced by the second signal having the remaining bits of the input signal; a quantization unit performing quantization processing of the output signal of the addition unit and outputting a quantization signal having a predetermined number of bits; a first delay unit outputting the first delayed signal to the subtraction unit by delaying the quantization signal from the quantization unit; and a second delay unit outputting the second delayed signal to the addition unit by delaying the output signal of the addition unit, wherein the quantization unit selects specific bits included in the output signal of the addition unit and generates the quantization signal with the selected bits of the output signal of the addition unit.

The oversampling modulator device of the present invention uses the quantization unit which has the quantization width set to $2^k$ (k: a positive integer) and operates at high speed. According to the oversampling modulator device of the present invention, high-speed data processing and multiple-bit signal processing can be realized without increasing the circuit scale. Therefore, by using the high-speed oversampling modulator device of the present invention, it is possible to contribute to the production of integrated circuits with low cost and low power dissipation.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of preferred embodiments of the present invention with reference to the accompanying drawings.

Figure 1:
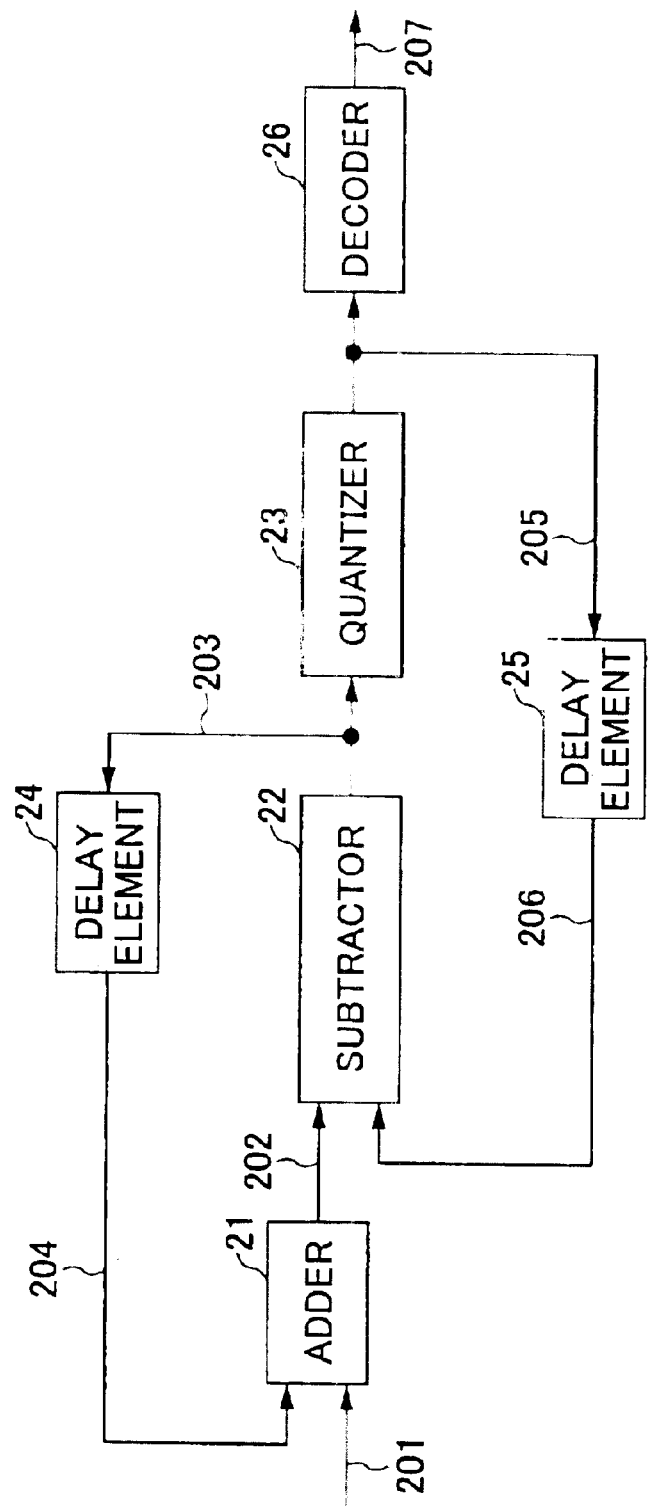
FIG. 1 is a block diagram of an example of a conventional oversampling modulator device.
Figure 2:
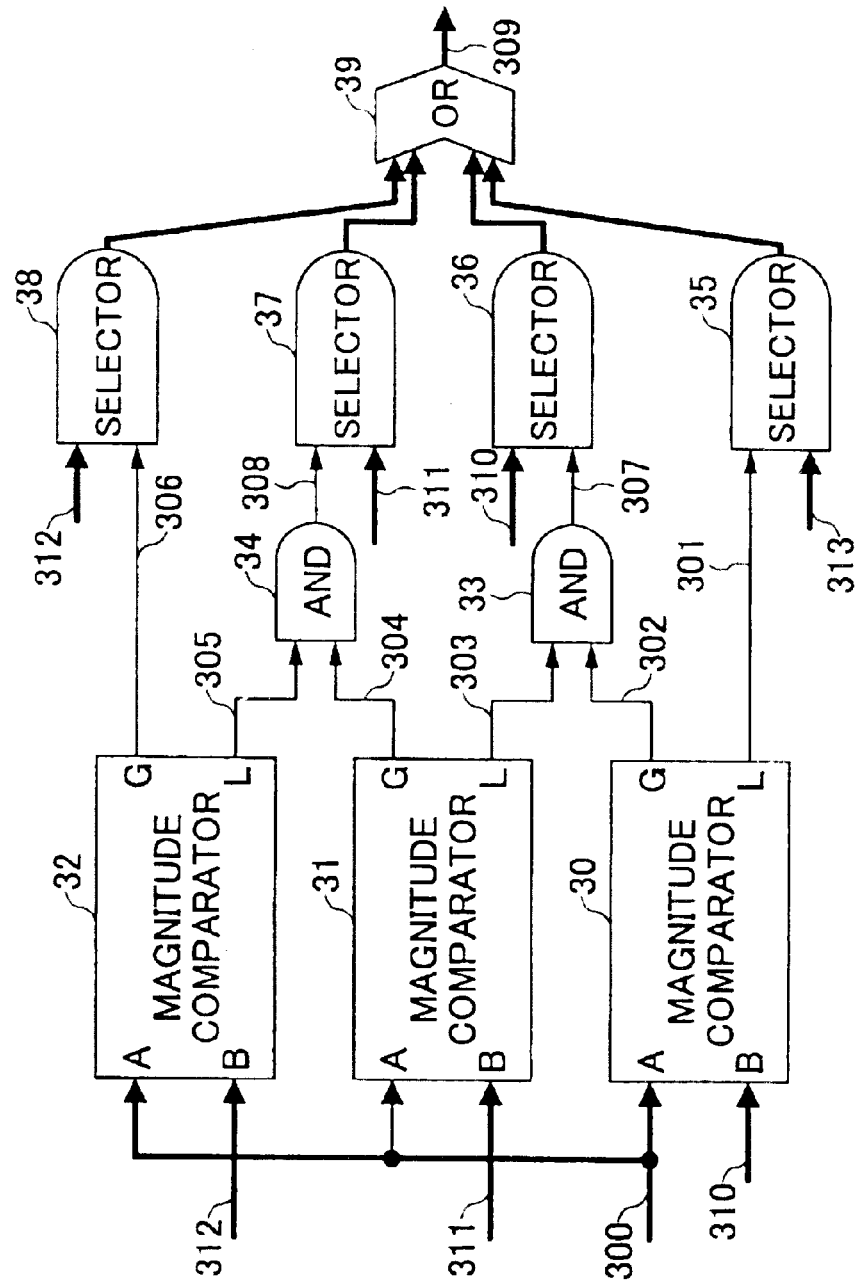
FIG. 2 is a block diagram of an example of a conventional quantizer.
Figure 3:
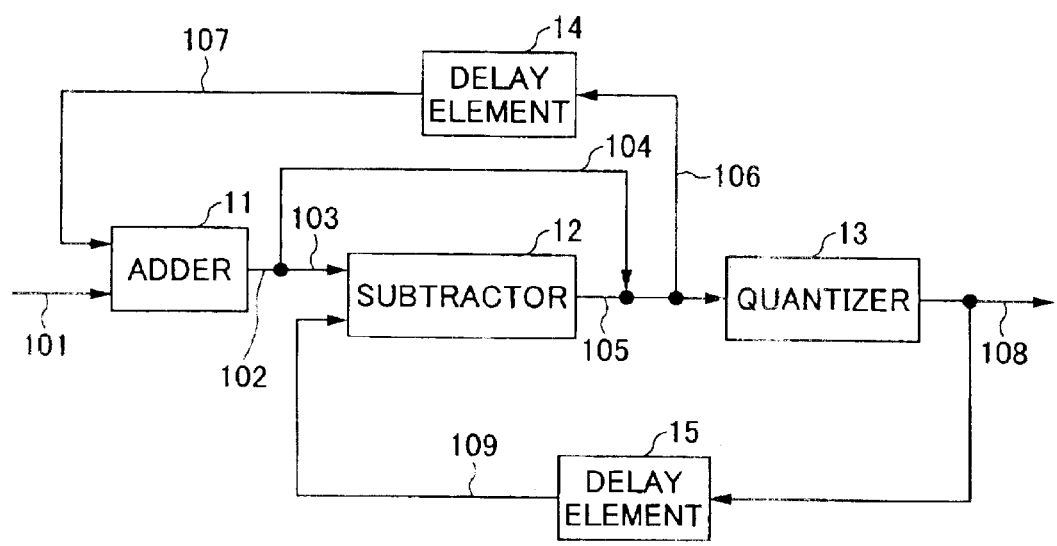
FIG. 3 is a block diagram of a primary oversampling modulator device of a first preferred embodiment of the present invention.

FIG. 3 shows a primary oversampling modulator device of a first preferred embodiment of the present invention.

Suppose that the oversampling modulator device of the present embodiment receives as an input signal a 10-bit straight binary signal. A description will be given of the oversampling modulator device of the present embodiment as a typical example.

The oversampling modulator device of FIG. 3 comprises an adder 11, a subtractor 12, a quantizer 13, a delay element 14, and a delay element 15. The signal 101 is the input signal to the oversampling modulator device, which is a 10-bit straight binary signal.

The data X indicated by the input signal 101 is represented by the following formula.

$$X = A_{10}2^9 + A_9 2^8 + A_8 2^7 + A_7 2^6 + A_6 2^5 + A_5 2^4 + A_4 2^3 + A_3 2^2 + A_2 2^1 + A_1 2^0$$

where $A_{10}$ is the bit indicating the ninth power of 2, $A_9$ is the bit indicating the eighth power of 2, $A_8$ is the bit indicating the seventh power of 2, $A_7$ is the bit indicating the sixth power of 2, $A_6$ is the bit indicating the fifth power of 2, $A_5$ is the bit indicating the fourth power of 2, $A_4$ is the bit indicating the third power of 2, $A_3$ is the bit indicating the second power of 2, $A_2$ is the bit indicating the first power of 2, and $A_1$ is the bit indicating the 0th power of 2.

The input signal 101 is composed of these ten bit lines. The numerical value of the input data X is expressed by giving a binary signal which indicates "1" or "0" to each of the ten bit lines, respectively. In the present embodiment, the uppermost bit $A_{10}$ indicating the highest power of 2 among the ten bits is called MSB (most significant bit), and the lowermost bit $A_1$ indicating the lowest power of 2 among the ten bits is called LSB (least significant bit).

Therefore, the range of the numerical value indicated by the 10-bit input signal 101 is 0 to 1023 in decimal number. When the data that is less than 0 or greater than 1024 is inputted to the oversampling modulator device, a malfunction occurs. To avoid this, it is necessary to increase the number of the bits on the circuit of the oversampling modulator device. In the following, for the sake of convenience of description, it is assumed that the oversampling modulator device of the present embodiment operates only in the limited range of the numerical value indicated by the 10-bit input signal 101.

In the oversampling modulator device of FIG. 3, the input signal 101 and the delay signal 107 serve as the input of the adder 11, and the adder 11 outputs the 10-bit signal 102 through the addition operation of the two signals, the signal 102 indicating a sum of the two signals 101 and 107.

The signal 102 outputted from the adder 11 is divided into the signal 103 and the signal 104. The signal 103 is composed of the three upper bits included in the signal 102, and the signal 104 is composed of the remaining lower bits (7 bits) included in the signal 102.

The 3-bit signal 103 from the adder 11 and the 3-bit delay signal 109 from the delay element 15 are inputted to the subtractor 12. The subtractor 12 outputs the 3-bit output signal 105 indicating a difference between the signal 103 and the signal 109.

The signal 106 is composed of the three upper bits produced by the output signal 105 of the subtractor 12 and the seven lower bits produced by the above-mentioned signal 104 from the adder 11. The 10-bit signal 106 is inputted to the quantizer 13. The quantizer 13 performs quantization processing of the signal 106, and outputs the quantization signal 108.

In the quantizer 13 of FIG. 3, the quantization width is set to 128. That is, the quantization levels in the present embodiment are the eight levels: 0, 128, 256, 384, 512, 640, 768 and 896.

More specifically, the quantizer 13 is provided to operate as follow: it outputs the quantization signal 108 indicating the value 0 when the input signal 106 indicates a value of 0 to 127; it outputs the quantization signal 108 indicating the value 128 when the input signal 106 indicates a value of 128 to 255; it outputs the quantization signal 108 indicating the value 256 when the input signal 106 indicates a value of 256 to 383; it outputs the quantization signal 108 indicating the value 384 when the input signal 106 indicates a value of 384 to 511; it outputs the quantization signal 108 indicating the value 512 when the input signal 106 indicates a value of 512 to 639; it outputs the quantization signal 108 indicating the value 640 when the input signal 106 indicates a value of 640 to 767; it outputs the quantization signal 108 indicating the value 768 when the input signal 106 indicates a value of 768 to 895; and it outputs the quantization signal 108 indicating the value 896 when the input signal 106 indicates a value above 896.

The quantization signal 108 from the quantizer 13 is returned to the delay element 15, and the delay element 15 delays the quantization signal 108 by one clock, and outputs the delay signal 109 to the subtractor 12.

The signal 106 is returned to the delay element 14, and the delay element 14 delays the signal 106 by one clock, and outputs the delay signal 107 to the adder 11.

Figure 4:
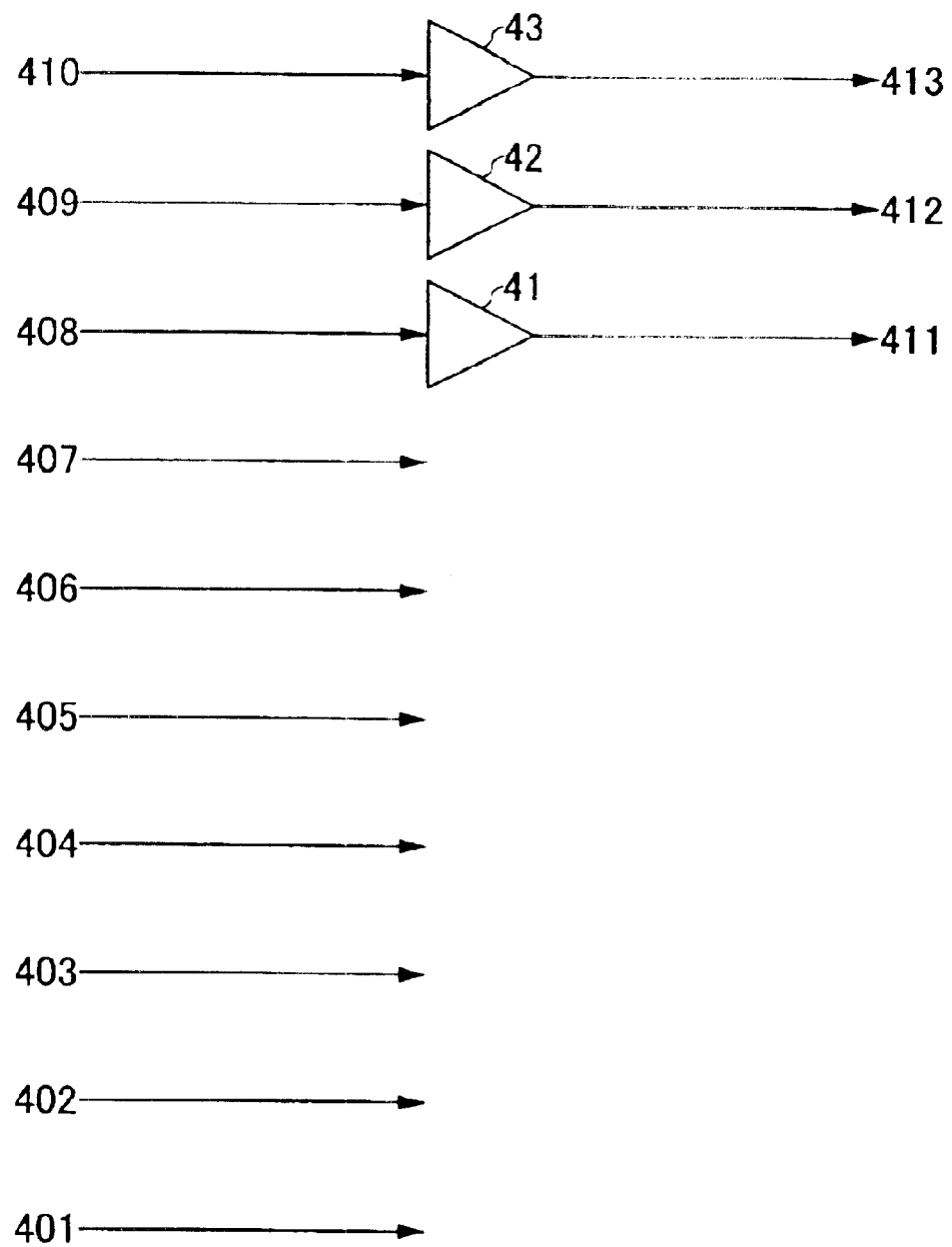
FIG. 4 is a block diagram of an example of a quantizer for use in the oversampling modulator device of FIG. 3.

FIG. 4 shows an example of the quantizer for use in the high-speed oversampling modulator device of FIG. 3.

The quantizer of FIG. 4 includes the buffers 41–43 connected to the input signal lines 408–410 included in the input signal lines 401–410, and the output signal lines 411–413 from which the 3-bit quantization signal from the buffers 41–43 is outputted to the subsequent-stage external device (not shown).

As shown in FIG. 4, the input signal lines 401–410 correspond to the signal lines used in the 10-bit input signal 106 at the input of the quantizer 13 in FIG. 3.

The data Y indicated by the signal 106 inputted to the quantizer 13 is represented by the following formula.

$$Y = B_{10}2^9 + B_9 2^8 + B_8 2^7 + B_7 2^6 + B_6 2^5 + B_5 2^4 + B_4 2^3 + B_3 2^2 + B_2 2^1 + B_1 2^0$$

The signal line 401 shows the bit $B_1$ which indicates the 0th power of 2. The signal line 402 shows the bit $B_2$ which indicates the first power of 2. The signal line 403 shows the bit $B_3$ which indicates the second power of 2. The signal line 404 shows the bit $B_4$ which indicates the third power of 2. The signal line 405 shows the bit $B_5$ which indicates the fourth power of 2. The signal line 406 shows the bit $B_6$ which indicates the fifth power of 2. The signal line 407 shows the bit $B_7$ which indicates the sixth power of 2. The signal line 408 shows the bit $B_8$ which indicates the seventh power of 2. The signal line 409 shows the bit $B_9$ which indicates the eighth power of 2. The signal line 410 shows the bit $B_{10}$ which indicates the ninth power of 2.

The signal 106 inputted to the quantizer 13 is composed of these ten bit lines 401 to 410. The numerical value of the input data Y is expressed by giving a binary signal which indicates "1" or "0" to each of the ten bit lines, respectively.

In the quantizer of the present embodiment, when the quantization width is 128 ($=2^7$), the three signals 410, 409 and 408, corresponding to the three upper bits included in the quantization signal outputted by the quantizer, are selected from among the input signals 401–410. According to the present embodiment, it is possible to configure the quantizer having the quantization width set to 128, and requiring a short delay time, without using the magnitude comparators as in the quantizer of the conventional device.

Similarly, if the quantization signal is produced from only the input signals 409 and 410 corresponding to the two upper bits included in the quantization signal, it is possible to configure the quantizer having the quantization width set to 256 (=$2^8$), and requiring a short delay time, without using the magnitude comparators. Furthermore, if the quantization signal is produced from only the input signals 407–410 corresponding to the four upper bits included in the quantization signal, it is possible to configure the quantizer having the quantization width set to 64 (=$2^6$), and requiring a short delay time, without using the magnitude comparators. In any case, what is necessary is just to select some bits included in the input bits of the quantizer as the output bits, the circuit scale is small, and it can be said that the delay time spent by the quantizer is very short.

In the case of the quantizer shown in FIG. 4, the quantization width is limited to a numerical value indicated by the expression $2^k$ (k: a positive integer), and cannot be set to a fine numerical value for the above reasons.

Next, a description will be given of another example of the quantizer for use in the high-speed oversampling modulator device of FIG. 3, with reference to FIG. 5.

Figure 5:
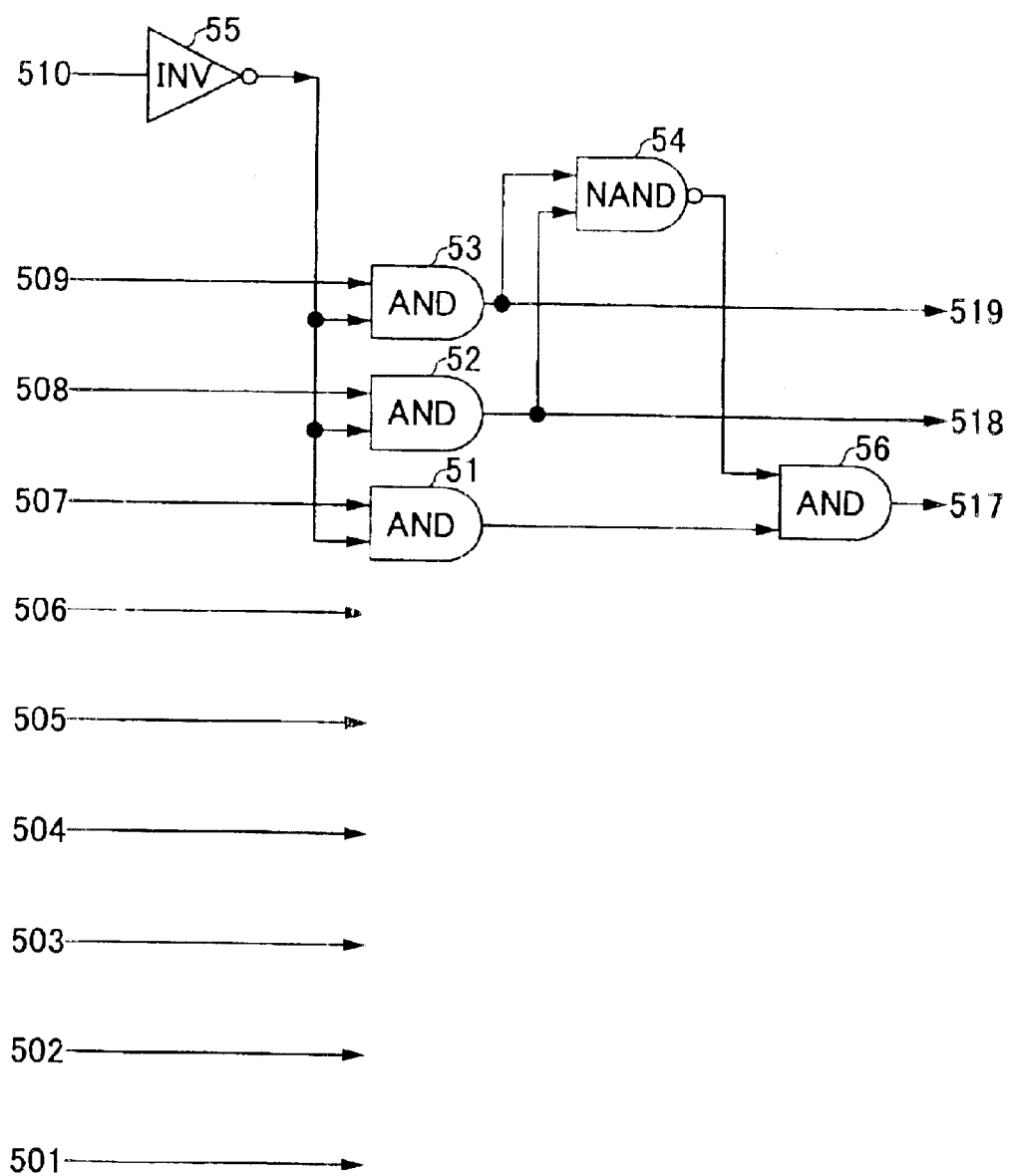
FIG. 5 is a block diagram of another example of the quantizer for use in the oversampling modulator device of FIG. 3.

FIG. 5 shows an example of the quantizer which operates in a limited rage between an upper limit and a lower limit for the input data.

The quantizer of FIG. 5 is provided with an overflow circuit which outputs a signal indicating the upper limit when the input data is larger than the upper limit, and an underflow circuit which outputs a signal indicating the lower limit when the input data is smaller than the lower limit. That is, in the quantizer of FIG. 5, the signal processing is carried out by taking into consideration the case in which the numerical value indicated by the signal lines is expressed with the two's complement with the sign.

In FIG. 5, the input signals 501–509 indicate the signal lines expressing $2^k$ (k=0–8), similar to the input signals 401–409 in the example of FIG. 4. The input signal 510 indicates the sign of the input numerical value. When the input signal 510 is set to 0, it means that the input numerical value is a positive number, and when the input signal 510 is set to 1, it means that the input numerical value is a negative number. Therefore, the range of the numerical value indicated by the 10-bit input signal is −512 to 511 in decimal number.

The quantizer of FIG. 5 includes AND gates 51, 52 and 53, a NAND gate 54, an inverter 55, and an AND gate 56.

The inverter 55 receives the input signal 510 indicating the sign of the input numerical value, and outputs the reversed signal 510 to one input of each of the AND gates 51, 52 and 53.

The AND gates 51, 52 and 53 respectively receive the input signals 507, 508 and 509 at the other inputs. Each of the AND gates 51, 52 and 53 outputs the signal in which the AND logic between the received input signal (the corresponding one of the signals 507, 508 and 509) and the output signal (the reversed signal 510) of the inverter 55 is taken.

The output signals of the AND gates 52 and 53 are sent to the output signal lines 518 and 519 of the quantizer, and the output signal of the AND gate 51 is sent to one input of the AND gate 56. The NAND gate 54 receives the output signals of the AND gates 52 and 53, and outputs the signal in which the NAND logic between the two received AND gate signals is taken. The output signal of the NAND gate 54 is sent to the other input of the AND gate 56. The AND gate 56 outputs the signal in which the AND logic between the received NAND gate signal and the received AND gate signal is taken, to the output signal line 517 of the quantizer. These logical elements 51–56 of the quantizer of FIG. 5 constitutes the above-mentioned overflow circuit and the above-mentioned underflow circuit.

In the quantizer of FIG. 5, the quantization width is set to 64. That is, the quantization levels in the present embodiment are set to 7 levels: 0, 64, 128, 192, 256, 320 and 384.

More specifically, the quantizer of FIG. 5 is provided to operate as follow. When the input numerical value ranges from 0 to 447, the quantizer receives the input signals 507 to 509, and normally outputs the signals 517 to 519 as the quantization signal.

When the input numerical value is smaller than 0 (or when the input signal 510 is set to 1), the input signals 507 to 509 to the quantizer are set to 0, and the signals 517 to 519 outputted as the quantization signal by the quantizer are set to 0. The output numerical value in this case is equal to 0 in decimal number (or the lower limit).

Moreover, when the input numerical value ranges 448 to 511 (or when the input signal 510 is set to 0 and the input signals 508 and 509 are both set to 1), the signals 518 and 519 outputted by the quantizer are set to 1 and the signal 517 outputted by the quantizer is set to 0. The output numerical value in this case is equal to 384 in decimal number (or the upper limit).

Therefore, the quantizer of FIG. 5 is provided to operate in the limited range between the upper limit and the lower limit for the input data by using the logical elements 51–56, so that the quantizer outputs a signal indicating the upper limit when the input data is larger than the upper limit, and outputs a signal indicating the lower limit when the input data is smaller than the lower limit.

The high-speed oversampling modulator device of the above-mentioned embodiment uses the quantizer which has the quantization width set to $2^k$ (k: a positive integer) and operates at high speed. According to the oversampling modulator device of the present embodiment, high-speed data processing and multiple-bit signal processing can be realized without increasing the circuit scale. Therefore, by using the high-speed oversampling modulator device of the present embodiment, it is possible to contribute to the production of integrated circuits with low cost and low power dissipation.

Figure 6:
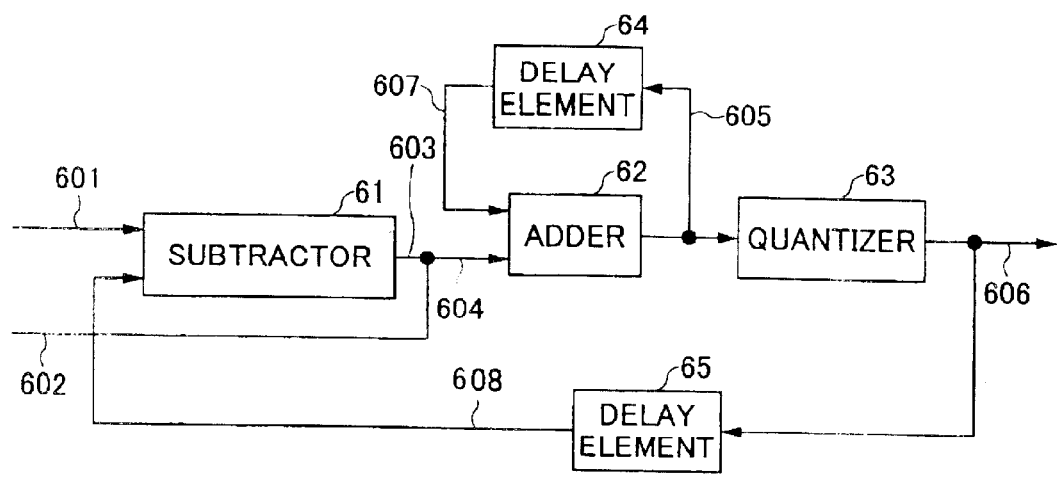
FIG. 6 is a block diagram of a primary oversampling modulator device of a second preferred embodiment of the present invention.

Next, FIG. 6 shows a primary oversampling modulator device of a second preferred embodiment of the present invention.

The embodiment of FIG. 6 is another example of the oversampling modulator device in which the above-described quantizer according to the present invention is provided. The present embodiment of FIG. 6 differs from the previous embodiment of FIG. 3 in that the sequence of the operations of the adder and the subtractor is reversed.

In the previous embodiment of FIG. 3, the subtraction operation is performed after the addition operation for the input signal 101 is performed. However, in the present embodiment of FIG. 6, the subtraction operation for the input signal 601 is performed prior to the addition operation.

The oversampling modulator device of FIG. 6 comprises a subtractor 61, an adder 62, a quantizer 63, a delay element 64, and a delay element 65. Suppose that the first signal 601 is composed of the three upper bits of the 10-bit straight binary input signal to the oversampling modulator device, and the second signal 602 is composed of the seven lower bits of the input signal to the oversampling modulator device.

In the oversampling modulator device of FIG. 6, the 3-bit input signal 601 and the 3-bit delay signal 608 serve as the two inputs of the subtractor 61. The subtractor 61 performs the subtraction operation of the delay signal 608 and the first signal 601, and outputs the 3-bit signal 603 indicating a difference between the delay signal 608 and the first signal 601.

Moreover, suppose that the 10-bit signal 604 is composed of the three upper bits produced by the output signal 603 of the subtractor 61, and the seven lower bits produced by the second signal 602. The signal 604 and the 10-bit delay signal 607 are inputted to the adder 62. The adder 62 performs the addition operation of the signal 604 and the delay signal 607, and outputs the 10-bit signal 605 indicating a sum of the signal 604 and the delay signal 607.

The output signal 605 of the adder 62 serves as the input of the quantizer 63. The quantizer 63 of this embodiment is provided to have the same composition as the quantizer of FIG. 4 or FIG. 5 in the previous embodiment. The quantizer 63 performs quantization processing of the signal 605 and outputs the 3-bit quantization signal 606.

Moreover, the 10-bit output signal 605 of the adder 62 is returned to the delay element 64. The delay element 64 outputs the above-mentioned delay signal 607 to one input of the adder 62 by delaying the signal 605 by one clock.

Furthermore, the 3-bit output signal 606 of the quantizer 63 is returned to the delay element 65. The delay element 65 outputs the above-mentioned delay signal 608 to one input of the subtractor 61 by delaying the signal 606 by one clock.

The oversampling modulator device of FIG. 6 is configured such that the sequence of the operations of the adder and the subtractor is reversed from that of the oversampling modulator device of FIG. 3. Other operations of the present embodiment are essentially the same as those of the previous embodiment of FIG. 3, and a duplicate description thereof will be omitted.

According to the high-speed oversampling modulator device of the above-mentioned embodiment which uses the quantizer which has the quantization width set to $2^k$ (k: a positive integer) and operates at high speed, high-speed data processing and multiple-bit signal processing can be realized without increasing the circuit scale. Therefore, by using the high-speed oversampling modulator device of the present embodiment, it is possible to contribute to the production of integrated circuits with low cost and low power dissipation.

Figure 7:
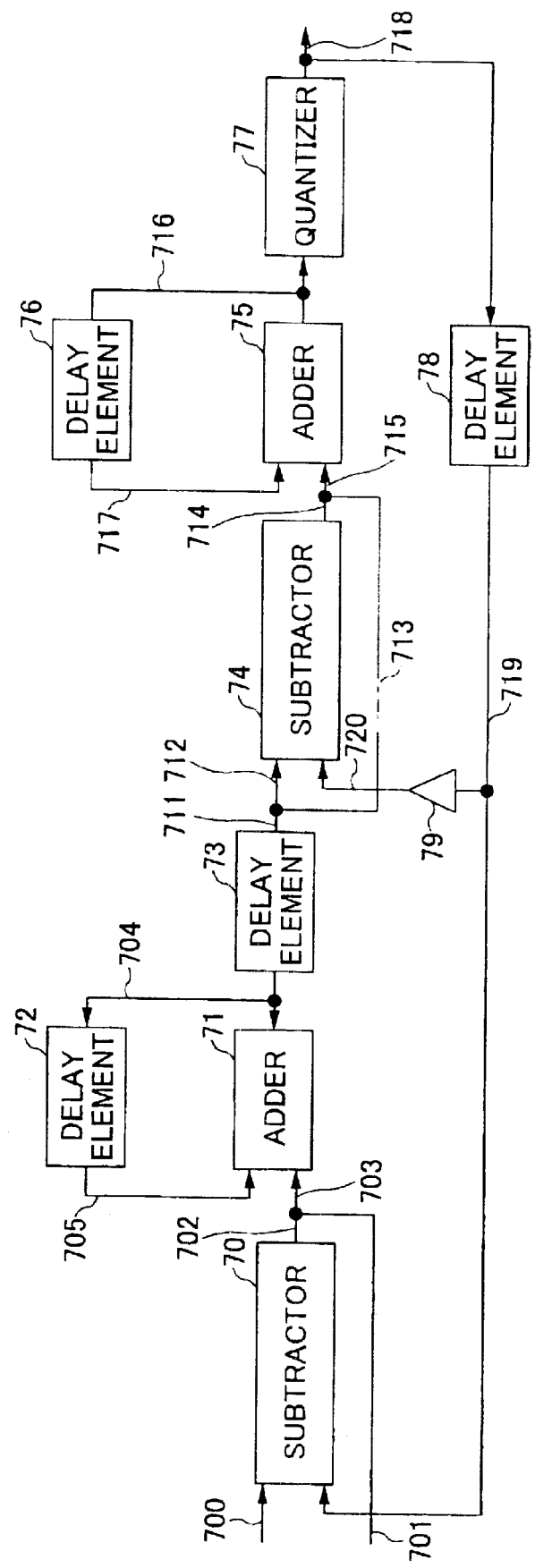
FIG. 7 is a block diagram of a secondary oversampling modulator device of a third preferred embodiment of the present invention.

Next, FIG. 7 shows a secondary oversampling modulator device of a third preferred embodiment of the present invention, which uses the quantizer according to the present invention.

The oversampling modulator device of FIG. 7 comprises a subtractor 70, a subtractor 74, an adder 71, an adder 75, delay elements 72 and 73, delay elements 76 and 78, a quantizer 77, and a multiplier 79.

Similar to the above-described embodiments, the case in which the oversampling modulator device of the present embodiment receives a 10-bit straight binary input signal as its input will be considered. Suppose that the first input signal 700 is composed of the three upper bits of the 10-bit input signal to the oversampling modulator device, and the second input signal 701 is composed of the seven lower bits of the input signal to the oversampling modulator device.

The first input signal 700 and the 3-bit delay signal 719 serve as the two inputs of the subtractor 70. The subtractor 70 performs the subtraction operation of the delay signal 719 and the first input signal 700, and outputs the 3-bit signal 702 indicating a difference between the delay signal 719 and the first input signal 700.

Moreover, suppose that the 10-bit signal 703 is composed of the three upper bits produced by the output signal 702 of the subtractor 70, and the seven lower bits produced by the second input signal 701. The signal 703 and the 10-bit delay signal 705 serve as the two inputs of the adder 71. The adder 71 performs the addition operation of the signal 703 and the delay signal 705, and outputs the 10-bit signal 704 indicating a sum of the signal 703 and the delay signal 705.

The output signal 704 of the adder 71 is sent to the delay element 72. The delay element 72 outputs the delay signal 705 to the one input of the adder 71 by delaying the input signal 704 by one clock. Moreover, the output signal 704 of the adder 71 is sent to the delay element 73. The delay element 73 outputs the 10-bit delay signal 711 by delaying the input signal 704 by one clock.

Suppose that the third signal 712 is composed of the three upper bits of the delay signal 711 from the delay element 73, and the fourth signal 713 is composed of the seven lower bits of the delay signal 711. The third signal 712 and the 3-bit delay signal 720 serve as the two inputs of the subtractor 74. The subtractor 74 performs the subtraction operation of the delay signal 720 and the third signal 712, and outputs the 3-bit signal 714 indicating a difference between the delay signal 720 and the third signal 712.

Moreover, suppose that the 10-bit fifth signal 715 is composed of the three upper bits produced by the output signal 714 of the subtractor 74, and the lower seven bits produced by the fourth signal 713 from the delay element 73. The fifth signal 715 and the 10-bit delay signal 717 serve as the two inputs of the adder 75. The adder 75 performs the addition operation of the fifth signal 715 and the delay signal 717, and outputs the 10-bit signal 716 indicating a sum of the fifth signal 715 and the delay signal 717.

The output signal 716 of the adder 75 is inputted to the delay element 76. The delay element 76 outputs the delay signal 717 to the one input of the adder 75 by delaying the input signal 716 by one clock.

Moreover, the output signal 716 of the adder 75 is inputted to the quantizer 77. The quantizer 77 of this embodiment is provided to have the same composition as the quantizer of FIG. 4 or FIG. 5 in the previous embodiment. The quantizer 77 performs quantization processing of the signal 716 and outputs the 3-bit quantization signal 718.

By using the quantizer according to the present invention, the delay time spent by the quantizer 77 becomes very short. Moreover, the output signal 718 of the quantizer 77 is composed of the three bits only, and the number of bits which is used by the subtractor 70 and the subtractor 74 for the subtraction operations becomes small. Therefore, the maximum of the delay time needed for the subtractors 70 and 74 can be made small, and high-speed data processing and multiple-bit signal processing can be attained by using the high-speed oversampling modulator device of the present embodiment.

The quantization signal 718 outputted from the quantizer 77 is returned to the delay element 78. The delay element 78 outputs the delay signal 719 by delaying the input signal 718 by one clock. The delay signal 719 is inputted to the one input of the subtractor 70 as mentioned above.

Moreover, the delay signal 719 is inputted to the multiplier 79. The multiplier 79 receives the delay signal 719 from the delay element 78, and outputs the 3-bit delay signal 720 to the one input of the subtractor 74 by computing an integral multiple of the delay signal 719. The delay signal 720 outputted to the subtractor 74 by the multiplier 79 indicates the multiplication result. For example, the delay signal 719 is doubled by the multiplier 79.

According to the high-speed oversampling modulator device of the above-mentioned embodiment which uses the quantizer which has the quantization width set to $2^k$ (k: a positive integer) and operates at high speed, high-speed data processing and multiple-bit signal processing can be realized without increasing the circuit scale. Therefore, by using the high-speed oversampling modulator device of the present embodiment, it is possible to contribute to the production of integrated circuits with low cost and low power dissipation.

Similar to the previous embodiment of FIG. 6, the secondary oversampling modulator device of FIG. 7 is configured so that the subtraction operation for the input signal is performed prior to the addition operation. However, the secondary oversampling modulator device of the present invention is not limited to this embodiment. For example, similar to the previous embodiment of FIG. 3, the secondary oversampling modulator device of the present embodiment may be configured so that the addition operation for the input signal is first performed, and the subtraction operation is subsequently performed.

The present invention is not limited to the above-described embodiments, and variations and modifications may be made without departing from the scope of the present invention.

What is claimed is:

1. An oversampling modulator device comprising:

an addition unit outputting an signal indicating a sum of an input signal and a first delayed signal, the input signal having a plurality of bits, the output signal divided into a first signal having a number of upper bits of the output signal and a second signal having the remaining bits of the output signal;

a subtraction unit outputting a signal indicating a difference between the first signal from the addition unit and a second delayed signal;

a first delay unit outputting the first delayed signal to the addition unit by delaying a third signal having upper bits produced by the output signal of the subtraction unit and lower bits produced by the second signal from the addition unit;

a quantization unit performing quantization processing of the third signal and outputting a quantization signal having a predetermined number of bits; and a second delay unit outputting the second delayed signal to the subtraction unit by delaying the quantization signal, wherein the quantization unit selects specific bits included in the third signal and generates the quantization signal with the selected bits of the third signal.

2. The oversampling modulator device of claim 1 wherein the quantization unit is provided to perform the quantization processing in a limited range between an upper limit and a lower limit for data indicated by the input signal, and comprises an overflow circuit outputting a signal indicating the upper limit when the data is larger than the upper limit, and an underflow circuit outputting a signal indicating the lower limit when the data is smaller than the lower limit.

3. The oversampling modulator device of claim 1 further comprising a multiplication unit receiving an output signal of the second delay unit and generating the second delayed signal as an output to the subtraction unit by computing an integral multiple of the received signal.

4. The oversampling modulator device of claim 1 wherein the quantization unit comprises signal lines corresponding to the specific bits in the third signal, and buffers connected to the signal lines, the quantization unit outputting the quantization signal from the buffers.

5. The oversampling modulator device of claim 1 wherein the quantization unit comprises: signal lines corresponding to the specific bits in the third signal; a plurality of first logical elements connected to the signal lines; and a second logical element receiving a signal indicating a sign of the data indicated by the input signal.

6. An oversampling modulator device comprising:

a subtraction unit outputting an signal indicating a difference between a first signal and a first delayed signal, the first signal having a number of upper bits included in an input signal, the input signal having a plurality of bits and being divided into the first signal and a second signal;

an addition unit outputting a signal indicating a sum of a third signal and a second delayed signal, the third signal having upper bits produced by the output signal of the subtraction unit and lower bits produced by the second signal having the remaining bits of the input signal;

a quantization unit performing quantization processing of the output signal of the addition unit and outputting a quantization signal having a predetermined number of bits;

a first delay unit outputting the first delayed signal to the subtraction unit by delaying the quantization signal from the quantization unit; and a second delay unit outputting the second delayed signal to the addition unit by delaying the output signal of the addition unit, wherein the quantization unit selects specific bits included in the output signal of the addition unit and generates the quantization signal with the selected bits of the output signal of the addition unit.

7. The oversampling modulator device of claim 6 wherein the quantization unit is provided to perform the quantization processing in a limited range between an upper limit and a lower limit for data indicated by the input signal, and comprises an overflow circuit outputting a signal indicating the upper limit when the data is larger than the upper limit, and an underflow circuit outputting a signal indicating the lower limit when the data is smaller than the lower limit.

8. The oversampling modulator device of claim 6 further comprising a multiplication unit receiving an output signal of the first delay unit and generating the second delayed signal as an output to the subtraction unit by computing an integral multiple of the received signal.

9. The oversampling modulator device of claim 6 wherein the quantization unit comprises signal lines corresponding to the specific bits in the third signal, and buffers connected to the signal lines, the quantization unit outputting the quantization signal from the buffers.

10. The oversampling modulator device of claim 6 wherein the quantization unit comprises: signal lines corresponding to the specific bits in the third signal; a plurality of first logical elements connected to the signal lines; and a second logical element receiving a signal indicating a sign of the data indicated by the input signal.

* * * * *